United States Patent
Kim et al.

(10) Patent No.: US 10,326,460 B2
(45) Date of Patent: Jun. 18, 2019

(54) WIDE-RANGE LOCAL OSCILLATOR (LO) GENERATORS AND APPARATUSES INCLUDING THE SAME

(71) Applicant: Samsung Electronics Co., Ltd., Suwon-si, Gyeonggi-do (KR)

(72) Inventors: Nam-seog Kim, Seoul (KR); Sang-soo Ko, Yongin-si (KR); Byoung-joong Kang, Incheon (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/869,437

(22) Filed: Jan. 12, 2018

(65) Prior Publication Data

US 2018/0205386 A1 Jul. 19, 2018

(30) Foreign Application Priority Data

Jan. 19, 2017 (KR) .................. 10-2017-0009373
Sep. 13, 2017 (KR) .................. 10-2017-0117224

(51) Int. Cl.
*H03L 5/02* (2006.01)
*H03L 7/00* (2006.01)
(Continued)

(52) U.S. Cl.
CPC .............. *H03L 7/24* (2013.01); *H03B 27/00* (2013.01); *H03K 5/1565* (2013.01);
(Continued)

(58) Field of Classification Search
CPC ...... H03L 7/00–7/24; H03L 5/00; H03L 5/02; H03B 19/00; H03B 27/00; H03B 2200/0074; H03K 21/17
See application file for complete search history.

(56) References Cited

U.S. PATENT DOCUMENTS 5,686,868 A * 11/1997 Hasegawa ............. C04B 18/022
331/108 C
6,288,585 B1 * 9/2001 Bando .................. G11C 7/1078
327/111
(Continued)

FOREIGN PATENT DOCUMENTS

KR 20100066717 A 6/2010
KR 100978088 B1 8/2010

OTHER PUBLICATIONS

Yung-Chung Lo et al., A 1.8VSub-mW, Over 100% Locking Range, Divide-by-3 and 7 Complimentary-Injection-Locked 4 GHz Frequency Divider, IEEE 2009 Custom Integrated Circuits Conference.

*Primary Examiner* — Duc M Nguyen
(74) *Attorney, Agent, or Firm* — Harness, Dickey & Pierce, P.L.C.

(57) ABSTRACT

A local oscillator generator (LO generator) may be configured to transmit an LO signal to a mixer. The LO generator may include an input buffer configured to generate a first internal oscillator signal based on the input oscillator signal. The LO generator may include a frequency dividing circuit configured to generate a second internal oscillator signal based on dividing a frequency of the first internal oscillator signal. The LO generator may include an output buffer configured to generate the LO signal based on the second internal oscillator signal. The input buffer and the frequency dividing circuit may each be configured to receive a power voltage independently of the output buffer.

19 Claims, 15 Drawing Sheets

(51) Int. Cl.
*H03B 27/00* (2006.01)
*H03K 21/17* (2006.01)
*H03L 7/099* (2006.01)
*H03L 7/24* (2006.01)
*H03K 21/02* (2006.01)
*H03K 5/156* (2006.01)
*H03K 21/10* (2006.01)
*H03L 7/10* (2006.01)

(52) U.S. Cl.
CPC .......... *H03K 21/026* (2013.01); *H03K 21/10* (2013.01); *H03L 5/02* (2013.01); *H03L 7/00* (2013.01); *H03L 7/0992* (2013.01); *H03B 2200/0074* (2013.01); *H03K 21/17* (2013.01); *H03L 7/101* (2013.01)

(56) References Cited

U.S. PATENT DOCUMENTS

| | | | |
|---|---|---|---|
| 6,882,580 B2 * | 4/2005 | Lim | G11C 7/22 327/156 |
| 7,711,339 B2 | 5/2010 | Mohammadi | |
| 7,778,097 B2 | 8/2010 | Chung et al. | |
| 7,924,098 B2 | 4/2011 | Nakayama et al. | |
| 8,081,018 B2 | 12/2011 | Ellersick | |
| 8,212,592 B2 * | 7/2012 | Fagg | H03B 27/00 327/115 |
| 8,212,619 B2 | 7/2012 | Han et al. | |
| 8,305,116 B2 | 11/2012 | Jang et al. | |
| 8,346,196 B2 | 1/2013 | Haralabidis et al. | |
| 8,390,343 B2 | 3/2013 | Chang et al. | |
| 8,487,670 B2 | 7/2013 | Fagg | |
| 8,493,105 B2 | 7/2013 | Chang et al. | |
| 8,536,917 B2 | 9/2013 | Hertle et al. | |
| 8,791,740 B2 | 7/2014 | Qiao et al. | |
| 8,791,763 B2 | 7/2014 | Taghivand | |
| 8,841,948 B1 * | 9/2014 | Chien | H03L 7/081 327/149 |
| 8,873,699 B2 | 10/2014 | Tertinek | |
| 8,971,825 B2 * | 3/2015 | Mo | H03B 19/00 455/313 |
| 9,197,161 B2 | 11/2015 | Asuri et al. | |
| 9,214,202 B2 | 12/2015 | Shim et al. | |
| 9,479,140 B2 | 10/2016 | Lin et al. | |
| 9,543,960 B1 * | 1/2017 | He | H03K 21/10 |
| 2001/0045849 A1 * | 11/2001 | Kurita | G06F 1/10 327/156 |
| 2007/0147571 A1 * | 6/2007 | Yu | H03K 21/023 377/47 |
| 2007/0285307 A1 * | 12/2007 | Nishijima | G01S 7/03 342/200 |
| 2008/0094109 A1 * | 4/2008 | Farjad-Rad | G06F 1/04 327/99 |
| 2008/0231379 A1 * | 9/2008 | Jang | H03K 3/0315 331/57 |
| 2009/0015340 A1 * | 1/2009 | Dally | H03K 3/0315 331/57 |
| 2009/0091361 A1 * | 4/2009 | Korpi | H03B 19/14 327/117 |
| 2009/0174486 A1 * | 7/2009 | Haralabidis | H03B 21/01 331/45 |
| 2011/0001521 A1 * | 1/2011 | Lorenzon | H03K 23/52 327/115 |
| 2012/0169387 A1 * | 7/2012 | Hara | G06F 1/08 327/156 |
| 2013/0043913 A1 * | 2/2013 | Tsai | G06F 1/08 327/115 |
| 2013/0120073 A1 * | 5/2013 | Okada | H03L 5/00 331/1 A |
| 2013/0141178 A1 | 6/2013 | Soe | |
| 2014/0159782 A1 | 6/2014 | Kennedy et al. | |
| 2015/0137898 A1 * | 5/2015 | Chillara | H03L 1/00 331/109 |
| 2015/0372665 A1 * | 12/2015 | Tohidian | H03K 5/133 331/57 |
| 2016/0072438 A1 * | 3/2016 | Fukahori | H03B 5/364 331/116 R |
| 2016/0329921 A1 * | 11/2016 | Jussila | H03B 27/00 |
| 2017/0012584 A1 * | 1/2017 | Lee | H03K 5/14 |
| 2017/0117904 A1 * | 4/2017 | Huang | H03L 7/083 |
| 2017/0373697 A1 * | 12/2017 | Schober | H03L 7/24 |

\* cited by examiner

WIDE-RANGE LOCAL OSCILLATOR (LO) GENERATORS AND APPARATUSES INCLUDING THE SAME

CROSS-REFERENCE TO RELATED APPLICATIONS

This application claims the benefit, under 35 U.S.C. § 119, of Korean Patent Application Nos. 10-2017-0009373, filed on Jan. 19, 2017, and 10-2017-0117224, filed on Sep. 13, 2017, in the Korean Intellectual Property Office, the disclosures of each of which are incorporated herein in their entirety by reference.

BACKGROUND

The inventive concepts relate to wireless communication, and more particularly, to local oscillator (LO) generators configured to generating LO signals and apparatuses including one or more LO generators.

Wireless communication apparatuses configured to support various standards of wireless communication systems, non-limiting examples of which include a code division multiple access (CDMA) system, a global system for mobile communication (GSM), and a long term evolution (LTE) system, may be widely used. In order to support various standards of wireless communication systems, wireless communication apparatuses may include a transceiver configured to support wideband communication, and the transceiver may use an LO signal to process a signal that is received according to a carrier having a wide range of frequencies. Not only a width of a band that may be supported by the transceiver but also a size of power that is consumed by the transceiver may be very important, for example, in portable terminals which operate by means of batteries. Accordingly, a transceiver that supports wideband and at the same time, consumes low power is desired.

SUMMARY

The inventive concepts may provide a local oscillator (LO) generator that is configured to provide an LO signal having a wide range of frequencies in a wireless communication system, and an apparatus including the LO generator.

According to some example embodiments, a local oscillator generator (LO generator) configured to transmit an LO signal to a mixer may include an input buffer configured to generate a first internal oscillator signal based on the input oscillator signal, a frequency dividing circuit configured to generate a second internal oscillator signal based on dividing a frequency of the first internal oscillator signal, and an output buffer configured generate the LO signal based on the second internal oscillator signal. The input buffer and the frequency dividing circuit may each be configured to receive a power voltage independently of the output buffer.

According to some example embodiments, an apparatus for wireless communication may include a local oscillator generator (LO generator) configured to generate an LO signal based on dividing a frequency of an input oscillator signal, the LO generator further configured to receive a first power voltage, a mixer configured to receive the LO signal, and a controller configured to control the frequency of the input oscillator signal and a frequency division ratio of the LO generator based on a carrier frequency of the wireless communication. The controller may be further configured to control the first power voltage based on the frequency of the input oscillator signal and the frequency division ratio of the LO generator.

According to some example embodiments, a frequency divider configured to divide a frequency of an oscillator signal of an oscillator may include an injection-locked oscillator. The injection-locked oscillator may include a plurality of gated inverter. The injection-locked oscillator may include a sequence of stages, each stage including at least two gated inverters of the plurality of gated inverters. Each gated inverter of the plurality of gated inverters may include first and second PMOS transistors and first and second NMOS transistors which are each a fin field-effect transistor (FinFET), the first and second PMOS transistors and the first and second NMOS transistors connected in series sequentially from a positive power voltage to a negative power voltage. The frequency divider may be configured to generate, in a given stage of the sequence of stages, an input signal of a next stage in a plurality of drains of the second PMOS transistor and the first NMOS transistor of a gate inverter of the given stage, respectively. The frequency divider may be configured to apply, in the given stage of the sequence of stages, an output signal of a previous stage to a plurality of gates of the first PMOS transistor and the second NMOS transistor of the gate inverter of the given stage, respectively, respectively. The frequency divider may be configured to apply the oscillator signal to a plurality of gates of the second PMOS transistor and the first NMOS transistor of the gate inverter of the given stage, respectively.

BRIEF DESCRIPTION OF THE DRAWINGS

Example embodiments of the inventive concepts will be more clearly understood from the following detailed description taken in conjunction with the accompanying drawings in which.

DETAILED DESCRIPTION OF THE EMBODIMENTS

Figure 1:
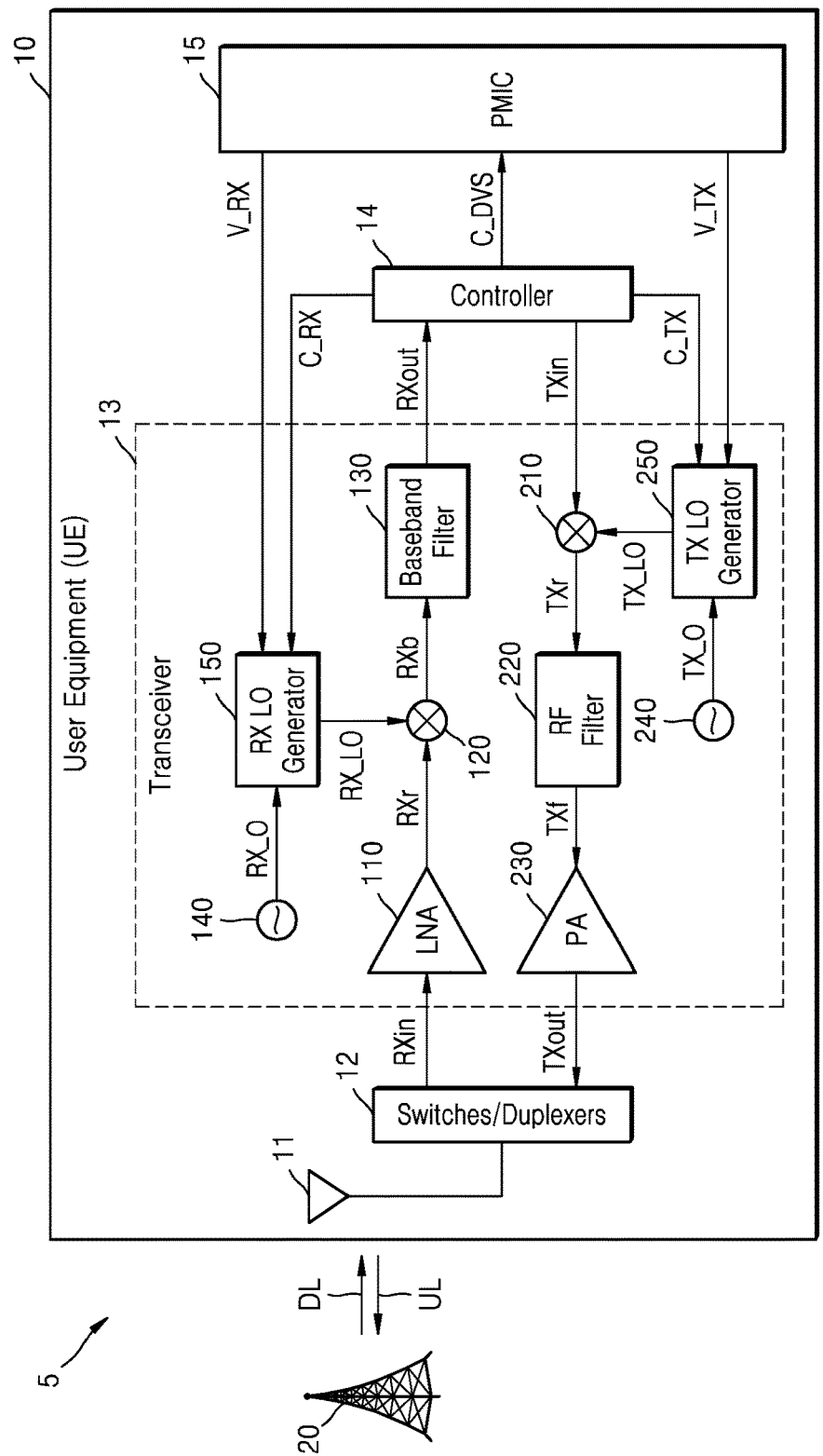
FIG. 1 is a block diagram of a wireless communication system including user equipment and a base station, according to some example embodiments of the present disclosure.

FIG. 1 is a block diagram of a wireless communication system 5 including user equipment (UE) 10 and a base station (BS) 20, according to some example embodiments of the present disclosure.

The wireless communication system 5 may be a standard communication system of, as non-limiting examples, a long term evolution (LTE) system, a code division multiple access (CDMA) system, a global system for mobile communication (GSM), a wireless local area network (WLAN) system, or any other wireless communication system. The wireless communication system 5 will be hereinafter described mainly with reference to an LTE system, but example embodiments of the present disclosure are not limited thereto.

The BS 20 may generally refer to a fixed station for communicating ("configured to communicate") with UE and/or another BS, and may exchange data and control information by communicating with UE and/or another BS. For example, the BS 20 may be referred to as a Node-B, an evolved-Node B (eNB), a sector, a site, a base transceiver system (BTS), an access point (AP), a relay node, a remote radio head (RRH), a radio unit (RU), a small cell, etc. In the present specification, the BS 20 or a cell may be construed as broadly meaning a partial area or function that a base station controller (BSC) in CDMA, a Node-B of wideband CDMA (WCDMA), an eNB or a section (site) in LTE, or the like covers, and may include all of various coverage areas such as a megacell, a macrocell, a microcell, a picocell, a femtocell, a relay node, a RRH, a RU, and a small cell communication range.

The UE 10, which is one or more instances of wireless communication equipment, may be fixed or be mobile, and may refer to various pieces ("instances") of equipment capable of communicating ("configured to communicate") with the BS 20 and transceiving data and/or control information. For example, the UE 10 may be referred to as terminal equipment, a mobile station (MS), a mobile terminal (MT), a user terminal (UT), a subscriber station (SS), a wireless device, a handheld device, etc.

A wireless communication network between the UE 10 and the BS 20 may support communication between a plurality of users by sharing available network resources. For example, information may be transmitted by various multiple access methods, such as CDMA, frequency division multiple access (FDMA), time division multiple access (TDMA), orthogonal frequency division multiple access (OFDMA), single carrier frequency division multiple access (SC-FDMA), OFDM-FDMA, OFDM-TDMA, and OFDM-CDMA, over the wireless communication network.

As shown in FIG. 1, the UE 10 and the BS 20 may communicate with each other through an uplink UL and a downlink DL. In the uplink UL and the downlink DL, data may be transmitted by a carrier at a frequency channel, and carrier aggregation simultaneously using a plurality of carriers may be used in the uplink UL or the downlink DL. A range of a frequency of a carrier that is used in the uplink UL and the downlink DL may be determined by a standard of wireless communication systems, and the UE 10 and/or the BS 20 may include a transceiver capable of processing a carrier having a wide range of frequencies to support various standards of wireless communication systems. For example, in order to communicate with BSs observing different standards of wireless communication systems, the UE 10 may include a transceiver 13 capable of processing a carrier having a wide range of frequencies. Example embodiments of the present disclosure will be hereinafter described mainly with reference to the UE 10 for convenience of description. However, it should be noted that the BS 20 may also include a transceiver according to some example embodiments of the present disclosure and elements for controlling the transceiver.

Referring to FIG. 1, the UE 10 may include an antenna 11, switches/duplexers 12, a transceiver 13, a controller 14, and a power management integrated circuit (PMIC) 15. The switches/duplexers 12 may provide a signal received through the antenna 11 to the transceiver 13 as an RX input signal RXin, and may provide a TX output signal TXout received from the transceiver 13 to the antenna 11.

The transceiver 13 may generate an RX output signal RXout by processing the RX input signal RXin and provide the RX output signal RXout to the controller 14, and as shown in FIG. 1, may include a low noise amplifier (LNA) 110, an RX mixer 120, a baseband filter 130, an RX oscillator 140, and an RX local oscillator (LO) generator 150 to process the RX input signal RXin and generate an RX LO signal RX_LO. The LNA 110 may amplify the RX input signal RXin, and the RX mixer 120 may receive the RX LO signal RX_LO and may generate an RX baseband signal RXb from the RX LO signal RX_LO and an output signal RXr of the LNA 110. The baseband filter 130 may generate the RX output signal RXout by removing unintended images from the RX baseband signal RXb.

Also, the transceiver 13 may generate a transmission output signal TXout by processing a TX input signal TXin received from the controller 14, and as shown in FIG. 1, may include a TX mixer 210, an RF filter 220, a power amplifier (PA) 230, a TX oscillator 240, and a TX LO generator 250 to process the TX input signal TXin and generate a TX LO signal TX_LO. The TX mixer 210 may receive the TX LO signal TX_LO and may generate a TX RF signal TXr from \the TX LO signal TX_LO and the TX input signal TXin. The RF filter 220 may generate a TX filtered signal TXf by removing unintended images from the TX RF signal TXr, and the PA 230 may generate the TX output signal TXout by amplifying the TX filtered signal TXf.

The RX LO generator 150 and the TX LO generator 250 may respectively generate LO signals RX_LO and TX_LO having a frequency that is the same as that of a carrier (e.g., RX_LO, TX_LO, and a carrier signal may have a common frequency). For example, the RX LO generator 150 may generate the RX LO signal RX_LO based on an RX oscillator signal RX_O ("input oscillator signal" RX_O) received from the RX oscillator 140 and an RX control signal C_RX received from the controller 14. Similarly, the TX LO generator 250 may generate the TX LO signal TX_LO based on a TX oscillator signal TX_O ("input oscillator signal" TX_O) received from the TX oscillator 240 and a TX control signal C_TX received from the controller 14. The RX LO generator 150 may generate the RX LO signal RX_LO based on dividing a frequency of an input RX oscillator signal RX_O received from the RX oscillator 140, and the TX LO generator 250 may generate the TX LO signal TX_LO based on dividing a frequency of an input TX oscillator signal TX_O received from the TX oscillator 240.

Although FIG. 1 shows one RX mixer 120 and one RX LO generator 150 for processing ("configured to process") the RX input signal RXin, example embodiments of the present disclosure are not limited thereto, and for example, the transceiver 13 may include a plurality of RX mixers and a plurality of RX LO generators for carrier aggregation. Similarly, the transceiver 13 may include a plurality of TX mixers and a plurality of TX LO generators for carrier aggregation. It will be understood that the RX LO generator 150 may be configured to provide (e.g., transmit) the RX LO signal RX_LO to the RX mixer 120, and the TX LO generator 250 may be configured to provide (e.g., transmit) the TX LO signal TX_LO to the TX mixer 210.

The controller 14 may receive a reception output signal RXout from the transceiver 13 and may provide a transmission input signal TXin to the transceiver 13. The controller 14 may process the RX output signal RXout, may generate the TX input signal TXin by processing data, and may be referred to as a data processor. Also, the controller 14 may generate control signals C_RX and C_TX for controlling the transceiver 13, and may provide a DVS control signal C_DVS to the PMIC 15. In some example embodiments, the controller 14 may include hardware logic designed through logic synthesis, and may include a processor for executing software stored in a memory, etc.

In some example embodiments, the controller 14 may obtain a carrier frequency of the downlink DL which is determined by the BS 20, and may control the RX LO generator 150 through the RX control signal C_RX so that the RX LO signal RX_LO may have a frequency that is the same as the carrier frequency. Similarly, in some example embodiments, the controller 14 may obtain a carrier frequency of the uplink UL which is determined by the BS 20, and may control the TX LO generator 250 through the TX control signal C_TX so that the TX LO signal TX_LO may have a frequency that is the same as the carrier frequency.

Although not shown in FIG. 1, in some example embodiments, the RX oscillator 140 may receive the RX control signal C_RX and may adjust a frequency of the RX oscillator signal RX_O, which is an input oscillator signal of the RX LO generator 150, according to the RX control signal C_RX. For example, the RX oscillator 140 may include at least one voltage controlled oscillator (VCO), and the VCO may be selected or a frequency of an output signal of the VCO may be adjusted according to the RX control signal C_RX. Similarly, in some example embodiments, the TX oscillator 240 may also receive the TX control signal C_TX.

As shown in FIG. 1, the RX LO generator 150 may receive a power voltage V_RX, and the TX LO generator 250 may receive a power voltage V_TX. Each power voltage of V_RX and V_TX may be referred to herein as a "first power voltage." In some example embodiments, the controller 14 may adjust power voltages V_RX and V_TX which are generated by the PMIC 15 through the DVS control signal C_DVS based on the obtained carrier frequency. For example, when a frequency of an oscillator signal that is processed at the inside of the RX LO generator 150 is relatively low, the controller 14 may drop a RX power voltage V_RX. When a frequency of an oscillator signal (e.g., RX_O) that is processed at the inside of the RX LO generator 150 is relatively high, the controller 14 may raise the RX power voltage V_RX. That is, the controller 14 may perform dynamic voltage scaling (DVS) according to a frequency of an internal oscillator signal of the RX LO generator 150. Similarly, the controller 14 may adjust a TX power voltage V_TX. When the carrier frequency is low, the RX power voltage V_RX does not necessarily drop, and as described below with reference to FIG. 4, etc., in some example embodiments, for the RX LO signal RX_LO to have an intended ("particular") frequency, the RX power voltage V_RX may be adjusted based on a frequency of the RX oscillator signal RX_O generated by the RX oscillator 140, a structure of the RX LO generator 150, etc.

When internal oscillator signals having a relatively low frequency are processed in the RX LO generator 150 and the TX LO generator 250, the power voltages V_RX and V_TX may drop, thereby decreasing power consumption by the RX LO generator 150 and the TX LO generator 250, and therefore advantageously promoting reduced power consumption by the UE 10 and thus promoting improved operational efficiency of the UE 10. Also, as described below with reference to FIG. 8B, etc., adjustment of the power voltages V_RX and V_TX of the RX LO generator 150 and the TX LO generator 250 may cause a change in a frequency tuning range of a frequency divider included in the RX LO generator 150 and the TX LO generator 250, and a changed frequency tuning range of the frequency divider may be combined with frequencies of oscillator signals RX_O and TX_O to expand an adjustable frequency range of LO signals RX_LO and TX_LO. Example embodiments of the present disclosure will be hereinafter described mainly with reference to the RX LO generator 150 for processing a signal received through the downlink DL. However, it will be understood that example embodiments of the present disclosure may also be applied to the TX LO generator 250.

Thus the controller 14 may be configured to control the frequency of the input oscillator signal RX_O and a frequency division ratio of the RX LO generator 150 based on a carrier frequency of the wireless communication, and the controller 14 may be further configured to control the first power voltage V_RX based on the frequency of the input oscillator signal RX_O and the frequency division ratio of the RX LO generator 150. Similarly, the controller 14 may be configured to control the frequency of the input oscillator signal TX_O and a frequency division ratio of the TX LO generator 250 based on a carrier frequency of the wireless communication, and the controller 14 may be further configured to control the first power voltage V_TX based on the frequency of the input oscillator signal TX_O and the frequency division ratio of the TX LO generator 250.

Figure 2A:
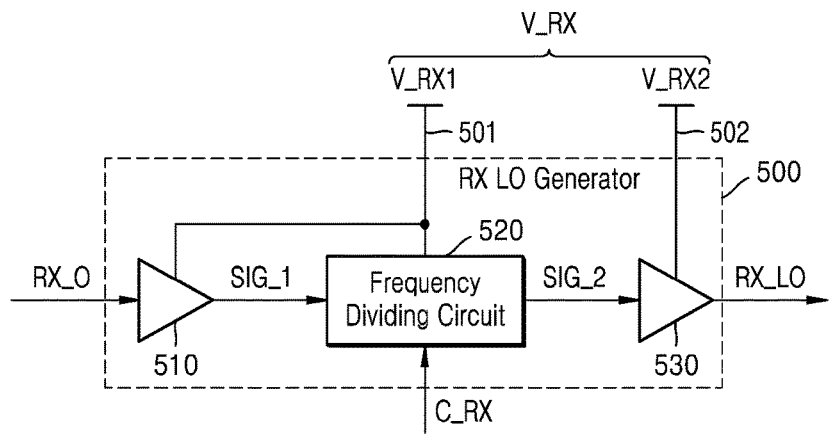
FIGS. 2A and 2B are block diagrams of examples of an RX LO generator of FIG. 1 according to some example embodiments of the present disclosure.
Figure 2B:
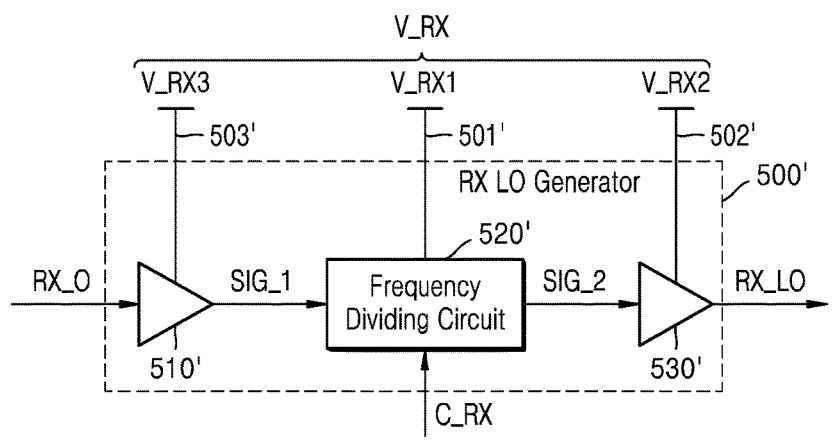

FIGS. 2A and 2B are block diagrams of examples of the RX LO generator 150 of FIG. 1 according to some example embodiments of the present disclosure. As described above with reference to FIG. 1, RX LO generators 500 and 500' of FIGS. 2A and 2B may receive a variable power voltage V_RX. FIGS. 2A and 2B will be described with reference to FIG. 1, and a repeated description of FIG. 1 will be omitted.

Referring to FIG. 2A, the RX LO generator 500 may generate the RX LO signal RX_LO from the RX oscillator signal RX_O according to the RX control signal C_RX, and may receive power from the RX power voltage V_RX including first and second power voltages V_RX1 and V_RX2. The RX LO generator 500 may include an input buffer 510, a frequency dividing circuit 520, and an output buffer 530.

The input buffer 510 may receive the RX oscillator signal RX_O (also referred to herein as an input oscillator signal with reference to the RX LO generator 500) and may output ("generate") a first internal oscillator signal SIG_1. The input buffer 510 may generate the first internal oscillator signal SIG_1 based at least in part on the RX oscillator signal RX_O. For example, the input buffer 510 may include at least one inverter. The frequency dividing circuit 520 may output ("generate") a second internal oscillator signal SIG_2 based on dividing a frequency of the first internal oscillator signal SIG_1 according to ("based on") the RX control signal C_RX. That is, a frequency division ratio of the first internal oscillator signal SIG_1 may be determined (e.g., by the frequency dividing circuit 520) based on the RX control signal C_RX. The output buffer 530 may receive the second internal oscillator signal SIG_2 and may output ("generate") the RX LO signal RX_LO. The output buffer 530 may generate the RX LO signal RX_LO based at least in part on the second internal oscillator signal SIG_2. For example, the output buffer 530 may include at least one inverter.

As shown in FIG. 2A, the input buffer 510 and the frequency dividing circuit 520 may be configured receive the first power voltage V_RX1 through a first path 501, and the output buffer 530 may receive the second power voltage V_RX2 through a second path 502. That is, the input buffer 510 and the frequency dividing circuit 520 may receive a power voltage (e.g., the first power voltage V_RX1) independently of the output buffer 530, and the first and second power voltages V_RX1 and V_RX2 may be mutually independently adjusted. Restated, the input buffer 510 and the frequency dividing circuit 520 may be configured to mutually independently receive power voltages, respectively. In some example embodiments, the first power voltage V_RX1 may be adjusted based on a frequency of the RX oscillator signal RX_O, and the second power voltage V_RX2 may be fixed. For example, a power voltage of a mixer (for example, 120 of FIG. 1) that receives the RX LO signal RX_LO may be fixed, and the second power voltage V_RX2 that is provided to the output buffer 530 may be fixed (for example, at a size ("magnitude") that is the same (e.g., a "common magnitude") as that of the power voltage of the mixer) to satisfy a high voltage level ("magnitude") of the RX LO signal RX_LO received ("utilized") by the mixer. In some example embodiments, the output buffer 530 may include a structure (for example, an AC-coupled buffer 30 of FIG. 3) for processing ("configured to process") the second internal oscillator signal SIG_2 having a variable high voltage level ("magnitude"). Also, in some example embodiments, both of the first and second power voltages V_RX1 and V_RX2 may be adjusted (e.g., adjusted in magnitude) based on a frequency of the RX oscillator signal RX_O.

Referring to FIG. 2B, the RX LO generator 500' may receive the RX power voltage V_RX including first power voltage V_RX1, second power voltage V_RX2, and third power voltage V_RX3 and may include an input buffer 510', a frequency dividing circuit 520', and an output buffer 530'.

Compared to the input buffer 510 and the frequency dividing circuit 520 of FIG. 2A, the input buffer 510' and the frequency dividing circuit 520' not only may receive power voltages V_RX3 and V_RX1 independently of the output buffer 530' but also may mutually independently receive the power voltages V_RX3 and V_RX1, respectively. For example, as shown in FIG. 2B, the input buffer 510' may receive the third power voltage V_RX3 through a third path 503', the frequency dividing circuit 520' may receive the first power voltage V_RX1 through a first path 501', and the output buffer 530' may receive the second power voltage V_RX2 through a second path 502'. In some example embodiments, at least one voltage of the first power voltage V_RX1, second power voltage V_RX2, and third power voltage V_RX3 may be determined and/or adjusted based on a frequency of the RX oscillator signal RX_O. Such determination and/or adjustment may be performed by the controller 14 as described with reference to FIG. 1. For example, the controller 14 may be configured to determine a magnitude of the third power voltage V_RX3 based on the frequency of the input oscillator signal RX_O and the frequency division ratio of the RX LO generator 150. Although RX LO generators that will be hereinafter described with reference to the accompanying drawings include an input buffer, a frequency dividing circuit, and an output buffer that mutually independently receive power voltages as shown in FIG. 2B, example embodiments of the present disclosure are not limited thereto, and it will be understood that an RX LO generator described below may include an input buffer and a frequency diving circuit that receive the same power voltage as shown in FIG. 2A.

Figure 3:
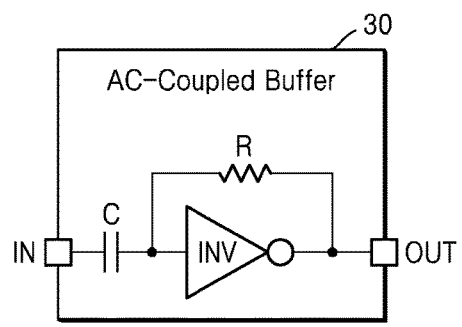
FIG. 3 is a block diagram of an AC-coupled buffer according to some example embodiments of the present disclosure.

FIG. 3 is a block diagram of the AC-coupled buffer 30 according to some example embodiments of the present disclosure. Hereinafter, FIG. 3 will be described with reference to FIGS. 2A and 2B.

As described above with reference to FIGS. 2A and 2B, at least one element from among elements of the RX LO generator 500 or 500' may receive a power voltage independently of the other element(s). For example, in the RX LO generator 500 of FIG. 2A, when the second power voltage V_RX2 that is provided to the output buffer 530 is fixed, and the first power voltage V_RX1 that is provided to the frequency dividing circuit 520 is adjusted, a high voltage level of the second internal oscillator signal SIG_2 may change. When a high voltage level of an oscillator signal changes, a circuit that receives the oscillator signal may not validly recognize a transition or a duty cycle of the oscillator signal. Accordingly, the output buffer 530 may include a structure for validly processing the second internal oscillator signal SIG_2 that has a changing high voltage level, and in some example embodiments, the output buffer 530 may include the AC-coupled buffer 30 that is configured to AC-couple the second internal oscillator signal SIG_2.

Referring to FIG. 3, the AC-coupled buffer 30 may include an inverter INV, a feedback resistor R, and a capacitor C, and may be referred to as an AC-coupled self-biased inverter buffer. As shown in FIG. 3, the feedback resistor R may have two ends connected to an input terminal of the inverter INV and an output terminal of the inverter INV, respectively, and the capacitor C may have a first end connected to an input terminal of the AC-coupled buffer 30 and a second end connected to the input terminal of the inverter INV. The first end of the capacitor may be configured to receive the second internal oscillator signal SIG_2. Accordingly, the AC-coupled buffer 30 may output an output oscillator signal OUT by validly recognizing a transition of an input oscillator signal IN in spite of a change of a high voltage level of the input oscillator signal IN.

Figure 4:
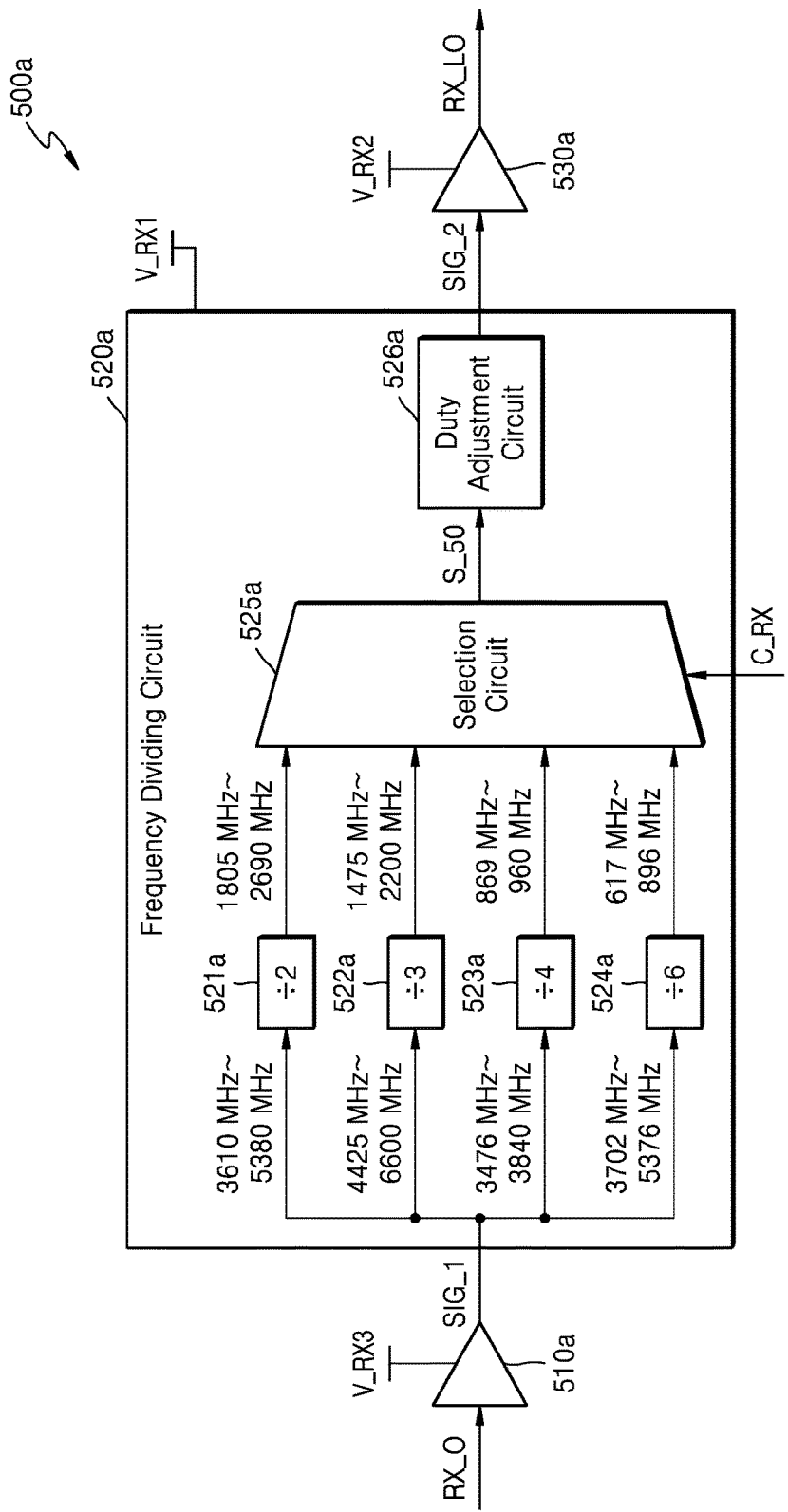
FIG. 4 is a block diagram of an RX LO generator according to some example embodiments of the present disclosure.

FIG. 4 is a block diagram of an RX LO generator 500a according to some example embodiments of the present disclosure. As shown in FIG. 4, the RX LO generator 500a may include an input buffer 510a that is configured to receive the third power voltage V_RX3, a frequency dividing circuit 520a that is configured to receive the first power voltage V_RX1, and an output buffer 530a that is configured to receive the second power voltage V_RX2.

Referring to FIG. 4, the frequency dividing circuit 520a may include a first frequency divider 521a, a second frequency divider 522a, a third frequency divider 523a, and a fourth frequency divider 524a. Restated, the frequency dividing circuit 520a may include a plurality of first frequency dividers (e.g., 521a to 524a). The plurality of first frequency dividers (e.g., 521a to 524a) may be configured to receive the first internal oscillator signal SIG_1, a selection circuit 525a, and a duty adjustment circuit 526a. As described above with reference to FIG. 1, etc., the RX oscillator signal RX_O may have a particular (or, alternatively, predetermined) frequency range, and in some example embodiments, the first internal oscillator signal SIG_1 output by the input buffer 510a may have the same frequency as the RX oscillator signal RX_O. The number ("quantity") and/or frequency division ratios of the first to fourth frequency dividers 521a to 524a included in the frequency dividing circuit 520a may be determined according to (e.g., may be based on) a frequency range of the RX oscillator signal RX_O and a range of a carrier frequency. For example, as shown in FIG. 4, each of the first to fourth frequency dividers 521a to 524a may have an allocated frequency range of the first internal oscillator signal SIG_1 and may divide a frequency of the first internal oscillator signal SIG_1 according to its frequency division ratio.

The selection circuit 525a may receive a plurality of oscillator signals output ("generated") by the first to fourth frequency dividers 521a to 524a and may select one of the plurality of oscillator signals according to the RX control signal C_RX. Restated, the plurality of first frequency dividers (e.g., 521a to 524a) may be configured to mutually independently divide the frequency of the first internal oscillator signal SIG_1 and generate separate, respective output signals of a plurality of output signals, and the selection circuit 525a may be configured to selectively output one output signal of the plurality of output signals of the plurality of first frequency dividers as the second internal oscillator signal S_50. In some example embodiments, an output signal S_50 of the selection circuit 525a may be the selected oscillator signal from among the plurality of oscillator signals, or may be an oscillator signal obtained by processing (for example, frequency division) the selected oscillator signal. The selection circuit may include at least one 2:1 multiplexer disposed in a hierarchical fashion.

The duty adjustment circuit 526a may generate the second internal oscillator signal SIG_2 by adjusting a phase of the output signal S_50 of the selection circuit 525a. For example, a duty cycle of the output signal S_50 of the selection circuit 525a may be different from that required by a mixer (for example, 140 of FIG. 1) that receives the RX LO signal RX_LO. Accordingly, the duty adjustment circuit 526a may adjust a phase of the output signal S_50 of the selection circuit 525a. The duty adjustment circuit 526a will be described in detail below with reference to FIGS. 5A and 5B.

The first to fourth frequency dividers 521a to 524a may receive the first power voltage V_RX1, and the first power voltage V_RX1 may be adjusted according to a frequency of the RX oscillator signal RX_O (or a frequency of the first internal oscillator signal SIG_1). For example, when the first internal oscillator signal SIG_1 that has a frequency range of 3610 MHz to 5380 MHz is assumed to be processed by the first frequency divider 521a, the selection circuit 525a, and the duty adjustment circuit 526a in this stated order, the first power voltage V_RX1 that is provided to the first frequency divider 521a may drop as the frequency of the first internal oscillator signal SIG_1 becomes close to 3610 MHz, whereas the first power voltage V_RX1 may rise as the frequency of the first internal oscillator signal SIG_1 becomes close to 5380 MHz. Accordingly, power consumption by the first frequency divider 521a may decrease compared to when the first power voltage V_RX1 is fixed.

Figure 5A:
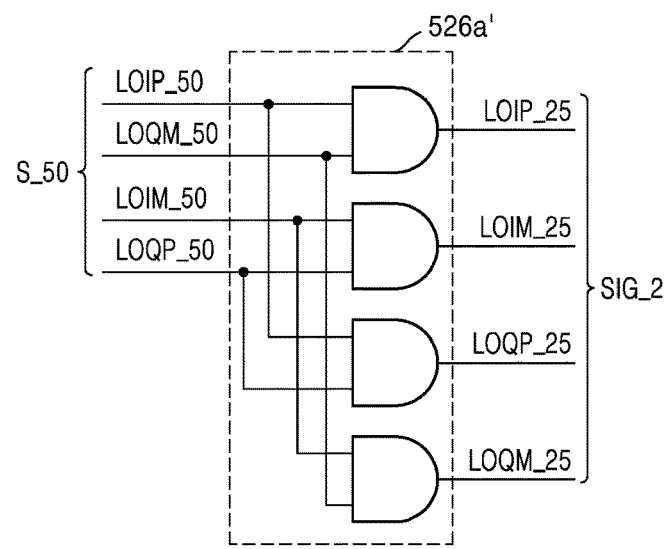
FIG. 5A is a block diagram of an example of a duty adjustment circuit of FIG. 4 according to some example embodiments of the present disclosure.
Figure 5B:
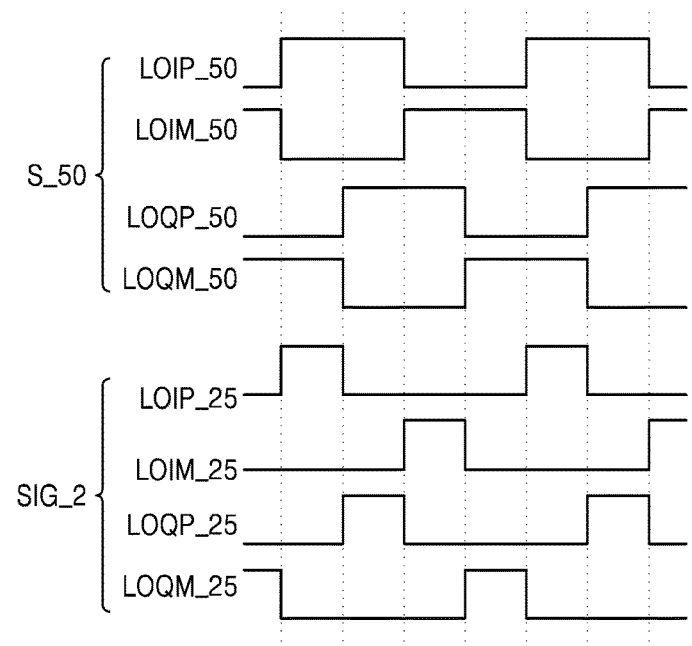
FIG. 5B is a waveform diagram of signals of FIG. 5A according to some example embodiments of the present disclosure.

FIG. 5A is a block diagram of an example of the duty adjustment circuit 526a of FIG. 4 according to some example embodiments of the present disclosure, and FIG. 5B is a waveform diagram of signals of FIG. 5A according to some example embodiments of the present disclosure. As described above with reference to FIG. 4, a duty adjustment circuit 526a' of FIG. 5A may output the second internal oscillator signal SIG_2 by adjusting a phase of the output signal S_50 of the selection circuit 525a. Hereinafter, FIGS. 5A and 5B will be described with reference to FIG. 4.

The output signal S_50 of the selection circuit 525a may have a duty cycle of 50%. For example, as shown in FIGS. 5A and 5B, the output signal S_50 of the selection circuit 525a may include signals LOIP_50 and LOIM_50 for I-channel and signals LOQP_50 and LOQM_50 for Q-channel, and the signals LOIP_50 and LOIM_50 for I-channel and the signals LOQP_50 and LOQM_50 for Q-channel may have a duty cycle of 50%. Also, as shown in FIG. 5B, there may be a phase difference of 25% between the signal LOIP_50 for I-channel and the signal LOQP_50 for Q-channel corresponding to each other.

The second internal oscillator signal SIG_2 may have a duty cycle of 25%. For example, as described above with reference to FIG. 4, the RX mixer 120 may be a passive mixer. A passive mixer may be configured to operate based on receiving an RX LO signal RX_LO that has a duty cycle of 25%, and accordingly, the second internal oscillator signal SIG_2 may have a duty cycle of 25%. As shown in FIG. 5B, the second internal oscillator signal SIG_2 may include signals LOIP_25, LOIM_25, LOQP_25, and LOQM_25 having a duty cycle of 25%, which correspond to the signals LOIP_50 and LOIM_50 for I-channel and the signals LOQP_50 and LOQM_50 for Q-channel.

Referring to FIG. 5A, the duty adjustment circuit 526a' may include four AND gates to generate four signals LOIP_25, LOIM_25, LOQP_25, and LOQM_25 having a duty cycle of 25% from the four signals LOIP_50, LOIM_50, LOQP_50, and LOQM_50 having a duty cycle of 50%. As shown in FIG. 5A, inputs of the four AND gates may be connected to one another.

Figure 6A:
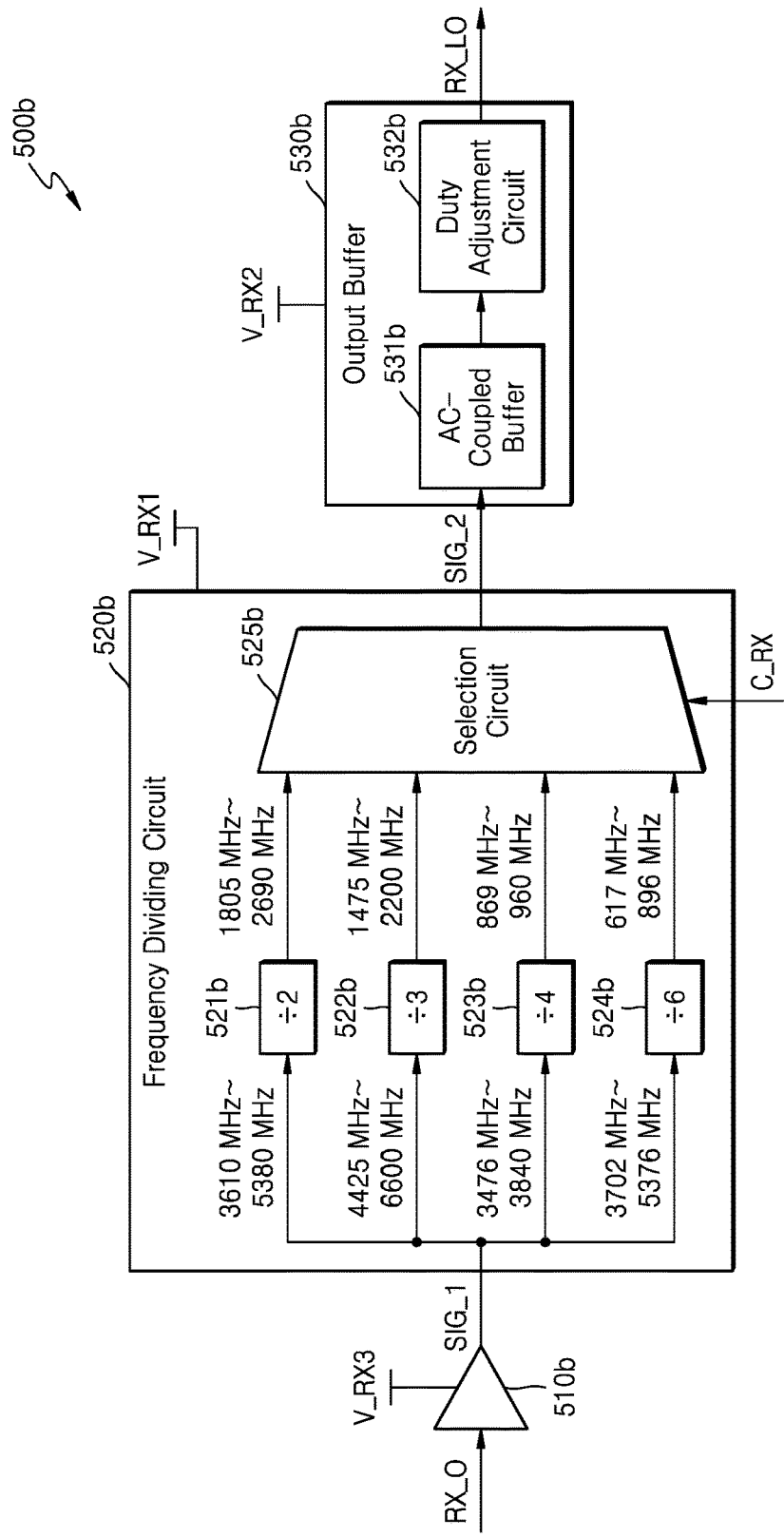
FIG. 6A is a block diagram of an RX LO generator according to some example embodiments of the present disclosure.
Figure 6B:
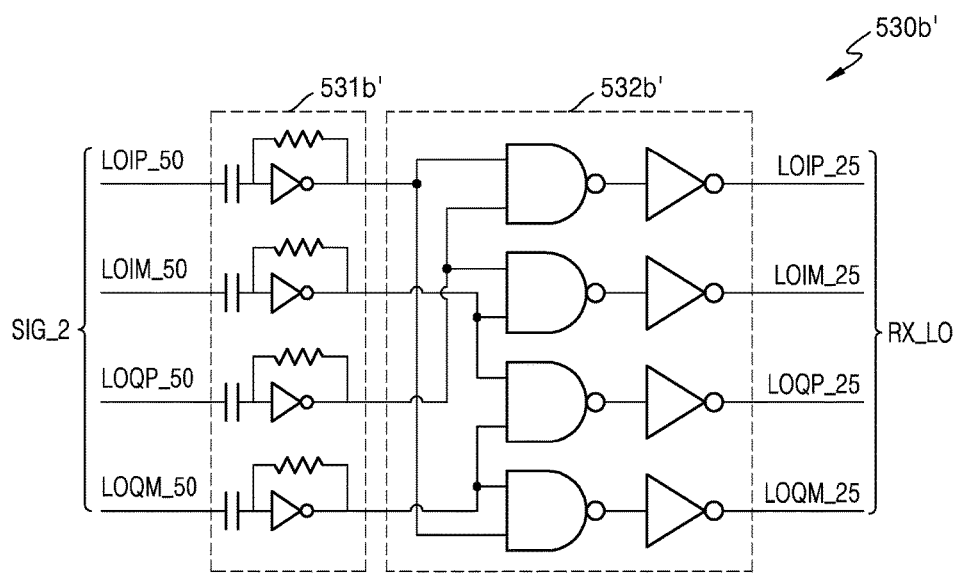
FIG. 6B is a block diagram of an example of an output buffer of FIG. 6A according to some example embodiments of the present disclosure.

FIG. 6A is a block diagram of an RX LO generator 500b according to some example embodiments of the present disclosure, and FIG. 6B is a block diagram of an example of an output buffer 530b of FIG. 6A according to some example embodiments of the present disclosure.

Referring to FIG. 6A, like the RX LO generator 500a of FIG. 4, the RX LO generator 500b of FIG. 6A may include an input buffer 510b, a frequency dividing circuit 520b, and an output buffer 530b, and the frequency dividing circuit 520b may include first frequency divider 521b, second frequency divider 522b, third frequency divider 523b, fourth frequency divider 524b, and a selection circuit 525b. The output buffer 530b may include an AC-coupled buffer 531b and a duty adjustment circuit 532b. Compared to the RX LO generator 500a of FIG. 4, the output buffer 530b of FIG. 6A may include the duty adjustment circuit 532b. As shown in FIG. 6A, the input buffer 510b may receive the third power voltage V_RX3, the frequency dividing circuit 520b may receive the first power voltage V_RX1, and the output buffer 530b may receive the second power voltage V_RX2.

Referring to FIG. 6B, like the duty adjustment circuit 526a' of FIG. 5B, an output buffer 530b' may receive the second internal oscillator signal SIG_2 including the four signals LOIP_50, LOIM_50, LOQP_50, and LOQM_50 having a duty cycle of 50% and may output the RX LO signal RX_LO including the four signals LOIP_25, LOIM_25, LOQP_25, and LOQM_25 having a duty cycle of 25%. Thus, output buffer 530b' may include a duty adjustment circuit (e.g., 532b) that is configured to generate a LO signal (e.g., RX_LO) such that the LO signal has a duty cycle of 25% from an output signal of the AC-coupled buffer, for example, where the RX mixer 120 may be a passive mixer configured to operate based on receiving an RX LO signal RX_LO that has a duty cycle of 25%.

An AC-coupled buffer 531b' may AC-couple each of the four signals LOIP_50, LOIM_50, LOQP_50, and LOQM_50, and output signals of the AC-coupled buffer 531b' may be input to a duty adjustment circuit 532b'. The duty adjustment circuit 532b' may include four NAND gates and four inverters, and as a result, may operate in a similar way to the duty adjustment circuit 526a' of FIG. 5B including four AND gates.

Figure 7:
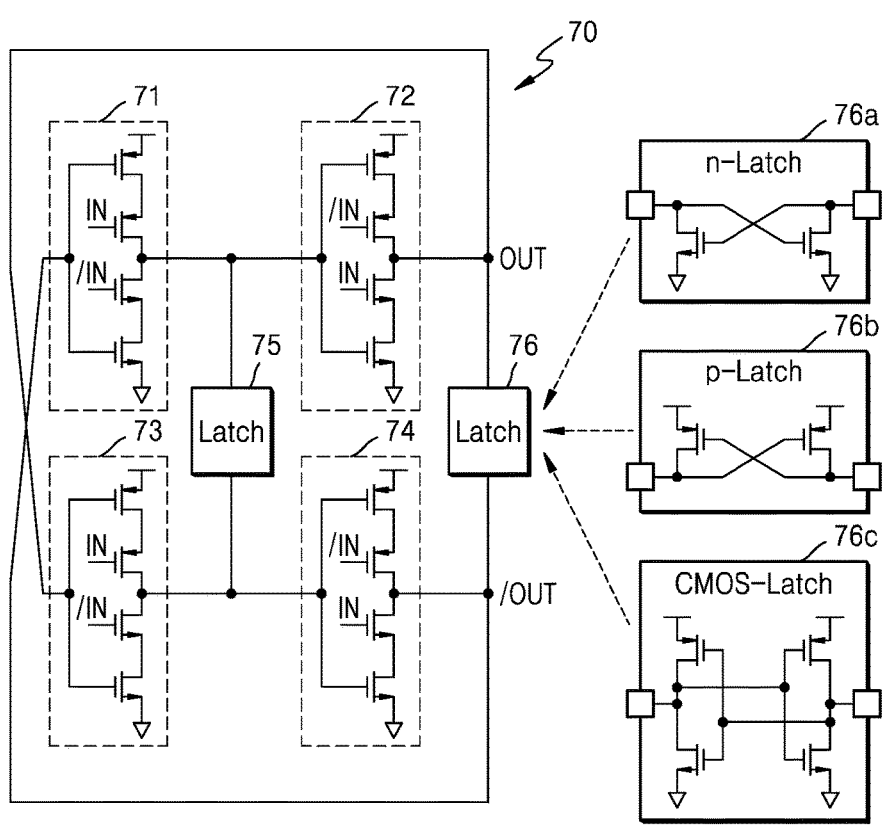
FIG. 7 is a circuit diagram of a frequency divider according to some example embodiments of the present disclosure.

FIG. 7 is a circuit diagram of a frequency divider 70 according to some example embodiments of the present disclosure. In more detail, FIG. 7 is an example circuit diagram of a divide-by-two frequency divider 70 that outputs the output oscillator signal OUT by dividing a frequency of the input oscillator signal IN by two.

As described above with reference to FIG. 4, etc., the frequency dividing circuit 520a of the RX LO generator 500a may include a plurality of frequency dividers, and as described above with reference to FIG. 5B, etc., differential oscillator signals are used. Therefore, the divide-by-two frequency divider 70 may receive differential signals IN and /IN, may output differential signals OUT and /OUT, and may be referred to as a divide-by-two differential frequency divider. Referring to FIG. 7, the divide-by-two frequency divider 70 may include gated inverters 71, 72, 73, and 74 and latches 75 and 76. Also, the latches 75 and 76 may be embodied in various ways, and as non-limiting examples, as shown in FIG. 7, an n-latch 76a, a p-latch 76b, a CMOS latch 76c, etc. may be used.

Figure 8A:
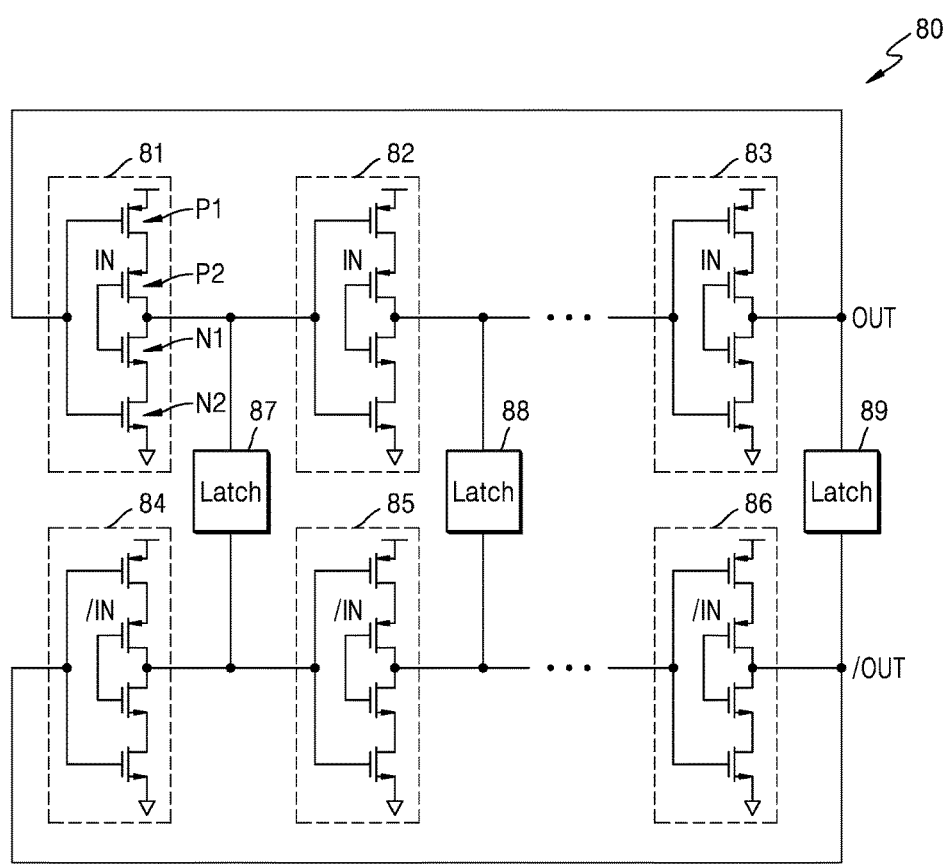
FIG. 8A is a circuit diagram of a frequency divider according to some example embodiments of the present disclosure.
Figure 8B:
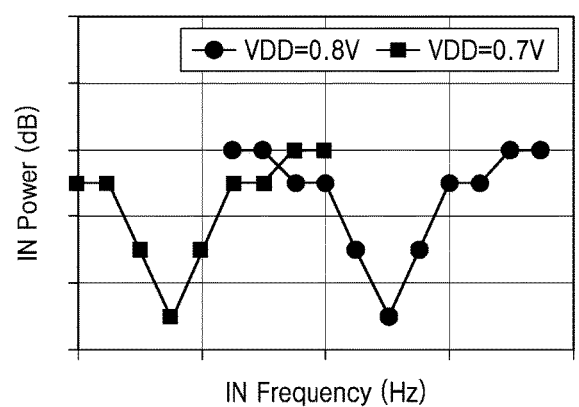
FIG. 8B is a graph showing characteristics of the frequency divider of FIG. 8A, according to some example embodiments of the present disclosure.

FIG. 8A is a circuit diagram of a frequency divider 80 according to some example embodiments of the present disclosure, and FIG. 8B is a graph showing characteristics of the frequency divider 80 of FIG. 8A, according to some example embodiments of the present disclosure. In more detail, FIG. 8A is an example circuit diagram of a divide-by-(2n+1) frequency divider 80 that outputs the output oscillator signal OUT by dividing the input oscillator signal IN by (2n+1), and FIG. 8B is a graph showing power of the input oscillator signal IN according to a frequency of the input oscillator signal IN of the divide-by-(2n+1) frequency divider 80 in each of different power voltages (that is, 0.7 V and 0.8 V).

Referring to FIG. 8A, the divide-by-(2n+1) frequency divider 80 may include a plurality of gated inverters 81, 82, 83, 84, 85, and 86 and a plurality of latches 87, 88, and 89. The number of gated inverters and latches included in the divide-by-(2n+1) frequency divider 80 may be determined by a frequency division ratio. For example, the number of gated inverters connected in series or the number of latches may be identical to (2n+1) and may be referred to as the number ("quantity") of stages of the divide-by-(2n+1) frequency divider 80. The divide-by-(2n+1) frequency divider 80 may be referred to as an injection-locked oscillator and may include (2n+1) stages, referred to herein as a sequence of stages. Thus, the frequency divider 80 may be configured to divide a frequency of the first internal oscillator signal SIG_1 at a frequency division ratio of (2n+1), wherein a value of n is 1 or a prime number.

One "given" stage of the divide-by-(2n+1) frequency divider 80 may include two gated inverters (for example, 81 and 84) for a differential signal. As shown in FIG. 8A, the gated inverter 81 may include first and second PMOS transistors P1 and P2 and first and second NMOS transistors N1 and N2 connected in series in this stated order between a positive supply voltage ("positive power voltage") (or a power voltage) and a negative supply voltage ("negative power voltage") (or a ground voltage). An output signal of a previous stage in relation to the given stage in the sequence of stages, that is, the output oscillator signal OUT output by the gated inverter 83, may be applied to gates of the first PMOS transistor P1 having a source to which the positive supply voltage is applied and the second NMOS transistor N2 having a source to which the negative supply voltage is applied in the gated inverter 81, and in the present specification, the first PMOS transistor P1 and the second NMOS transistor N2 may be referred to as tail transistors. Also, the input oscillator signal IN may be applied to gates of the second PMOS transistor P2 and the first NMOS transistor N1 respectively having drains from which an output signal of the gated inverter 81 is output, and in the present specification, the second PMOS transistor P2 and the first NMOS transistor N1 may be referred to as cascade transistors. In some example embodiments, each transistor of the first and second PMOS transistors P1 and P2 and the first and second NMOS transistors N1 and N2 in a given gate inverter (e.g., gate inverter 81) may be a fin field-effect transistor (FinFET).

When the input oscillator signal IN and the output oscillator signal OUT output from the previous stage of the sequence of stages are applied, as shown in FIG. 8A, to the gated inverter 81 differently, that is, when the input oscillator signal IN is applied to gates of the tail transistors and the output oscillator signal OUT is applied to gates of the cascade transistors, bandwidth may be limited as semiconductor processes become minute. In particular, when transistors included in the divide-by-(2n+1) frequency divider 80 are fin field-effect transistors (FinFETs), the influence of body bias on a channel may decrease differently from a planar transistor. For example, when the input oscillator signal IN is applied to gates of the tail transistors, additional capacitance between the cascade transistors may raise the load capacitance of a gated inverter. Accordingly, an output pole frequency may decrease, a size of an injection voltage that is generated by the input oscillator signal IN may be limited, and as a result, bandwidth may be limited. On the other hand, as shown in FIG. 8A, when the input oscillator signal IN is applied to gates of the cascade transistors and the output oscillator signal OUT is applied to gates of the tail transistors in the gated inverter 81, injection current is generated in the cascade transistors, and therefore, only load capacitance resulting from the latch 87 may dominate, and as result, load capacitance may decrease.

Restating the above, at least one first frequency divider 80 may be configured to generate, in a given stage of the sequence of stages (e.g., a stage including gated inverters 82 and 85), an input signal of a next stage (e.g., a stage including gated inverters 83 and 86) in a plurality of drains of a second PMOS transistor and a first NMOS transistor of a gate inverter of the given stage, respectively, and the at least one first frequency divider 80 may be configured to apply, in the given stage of the sequence of stages, an output signal of a previous stage (e.g., a stage including gated inverters 81 and 84) to a plurality of gates of a first PMOS transistor and a second NMOS transistor of the gate inverter of the given stage, respectively. The at least one first frequency divider 80 may be configured to apply the first internal oscillator signal SIG_1 to a plurality of gates of the second PMOS transistor and the first NMOS transistor of a gate inverter of a given stage (e.g., gate inverter 82), respectively.

Referring to FIG. 8B, the divide-by-(2n+1) frequency divider 80 of FIG. 8A may have a different frequency tuning range according to a power voltage. That is, a natural frequency of the injection-locked oscillator may change according to a size of the power voltage. For example, a frequency indicating the lowest power of the input oscillator signal IN at a power voltage given in the graph of FIG. 8B may denote a natural frequency of the divide-by-(2n+1) frequency divider 80. Accordingly, as shown in FIG. 8B, when a power voltage of 0.8 V is applied, the divide-by-(2n+1) frequency divider 80 may have a higher natural frequency compared to when a power voltage of 0.7 V is applied, and as a result, may have a higher frequency tuning range.

According to some example embodiments of the present disclosure, a power voltage provided to a frequency dividing circuit (for example, 520a of FIG. 4) may be adjusted, and a power voltage supplied to a frequency divider included in the frequency dividing circuit may also be adjusted. Accordingly, power consumed in the frequency dividing circuit may decrease, and as described above with reference to FIG. 8B, a frequency range that may be supported in the frequency dividing circuit may also change due to the frequency divider having a changing frequency tuning range. As a result, the frequency range that may be supported in the frequency dividing circuit may expand, thereby increasing the efficiency of a frequency dividing operation.

Figure 9A:
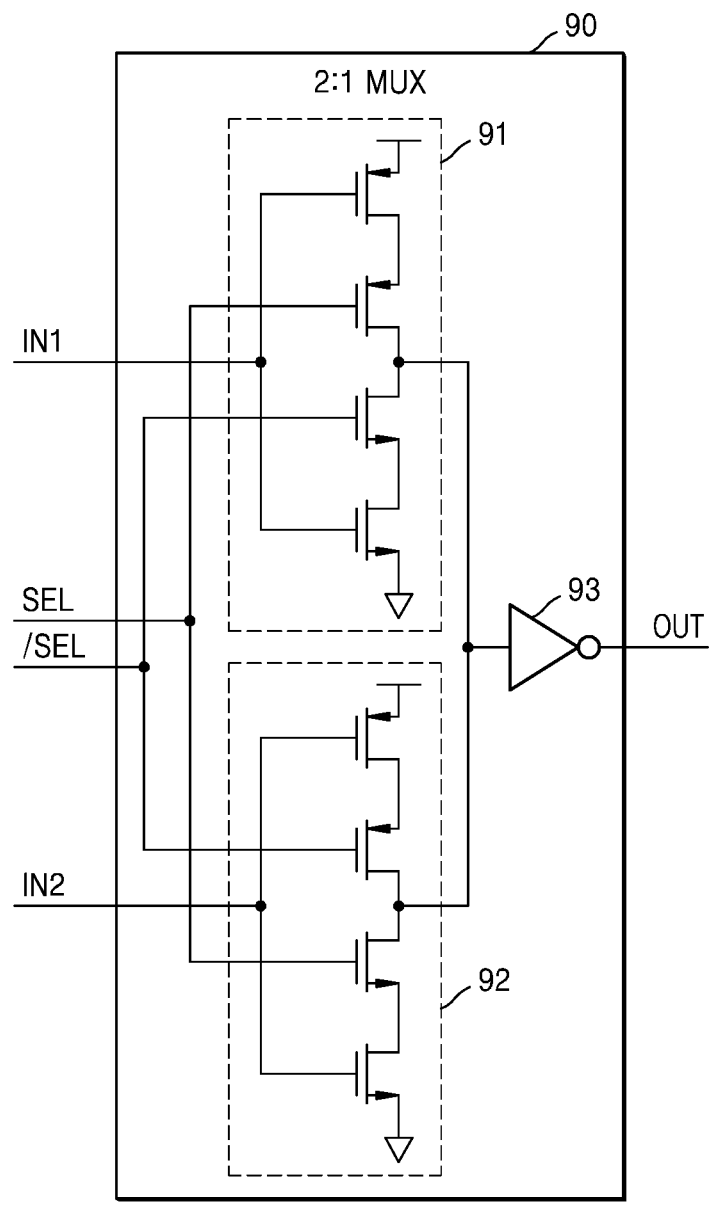
FIG. 9A is a block diagram of a multiplexer according to some example embodiments of the present disclosure.
Figure 9B:
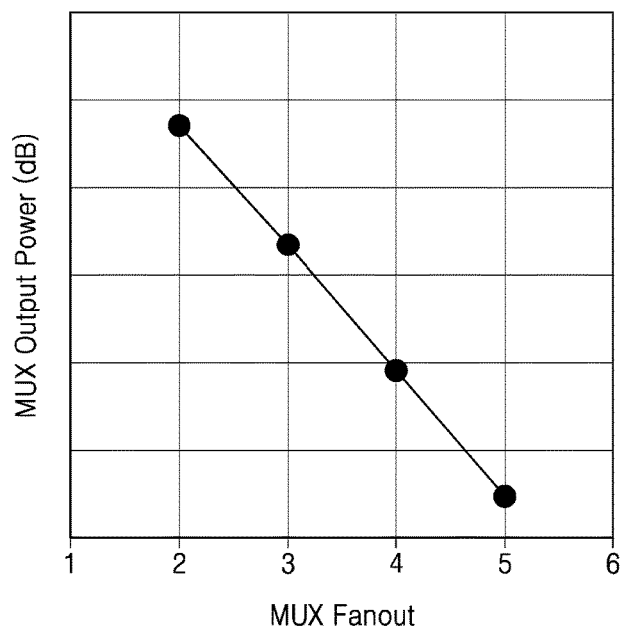
FIG. 9B is a graph showing output power according to a fanout of a multiplexer, according to some example embodiments of the present disclosure.

FIG. 9A is a block diagram of a multiplexer according to some example embodiments of the present disclosure, and FIG. 9B is a graph showing output power according to a fanout of a multiplexer, according to some example embodiments of the present disclosure. In more detail, FIG. 9A shows a 2:1 multiplexer 90 as an example of a multiplexer included in the selection circuit (for example, 525a of FIG. 4) described above, and FIG. 9B is a graph showing output power according to a fanout of a multiplexer including a gated inverter. In some example embodiments the 2:1 multiplexer 90 may include two gated inverters.

Referring to FIG. 9A, the 2:1 multiplexer 90 may include first and second gated inverters 91 and 92. The first gated inverter 91 may receive a first input signal IN1, and may reverse the first input signal IN1 or float output according to differential selection signals SEL and /SEL. Similarly, the second gated inverter 92 may receive a second input signal IN2, and may reverse the second input signal IN2 or float output according to the differential selection signals SEL and /SEL. Differently from that shown in FIG. 9A, when a multiplexer includes pass gates for passing or blocking the first and second input signals IN1 and IN2 according to the differential selection signals SEL and /SEL, bandwidth may be limited due to an additional parasitic element of a pass gate, whereas the 2:1 multiplexer 90 including the first and second gated inverters 91 and 92 may provide a relatively high bandwidth. In some example embodiments, an inverter 93 of FIG. 9A may be omitted.

Referring to FIG. 9B, output power of a multiplexer including gated inverters may change according to a fanout when a signal oscillating at a relatively high frequency is input. That is, as shown in FIG. 9B, output power of the multiplexer may decrease as a fanout increases, and as a result, a small fanout may be favorable to a signal oscillating at a high frequency. Accordingly, as described below with reference to FIGS. 10 and 11, in some example embodiments, a selection circuit (for example, 525a of FIG. 4) for selecting one of oscillator signals output by a plurality of frequency dividers may include a plurality of 2:1 multiplexers disposed in a hierarchical fashion. Also, in some example embodiments, the selection circuit may include a multiplexer (for example, 90 of FIG. 9A) including a plurality of gated inverters.

Figure 10:
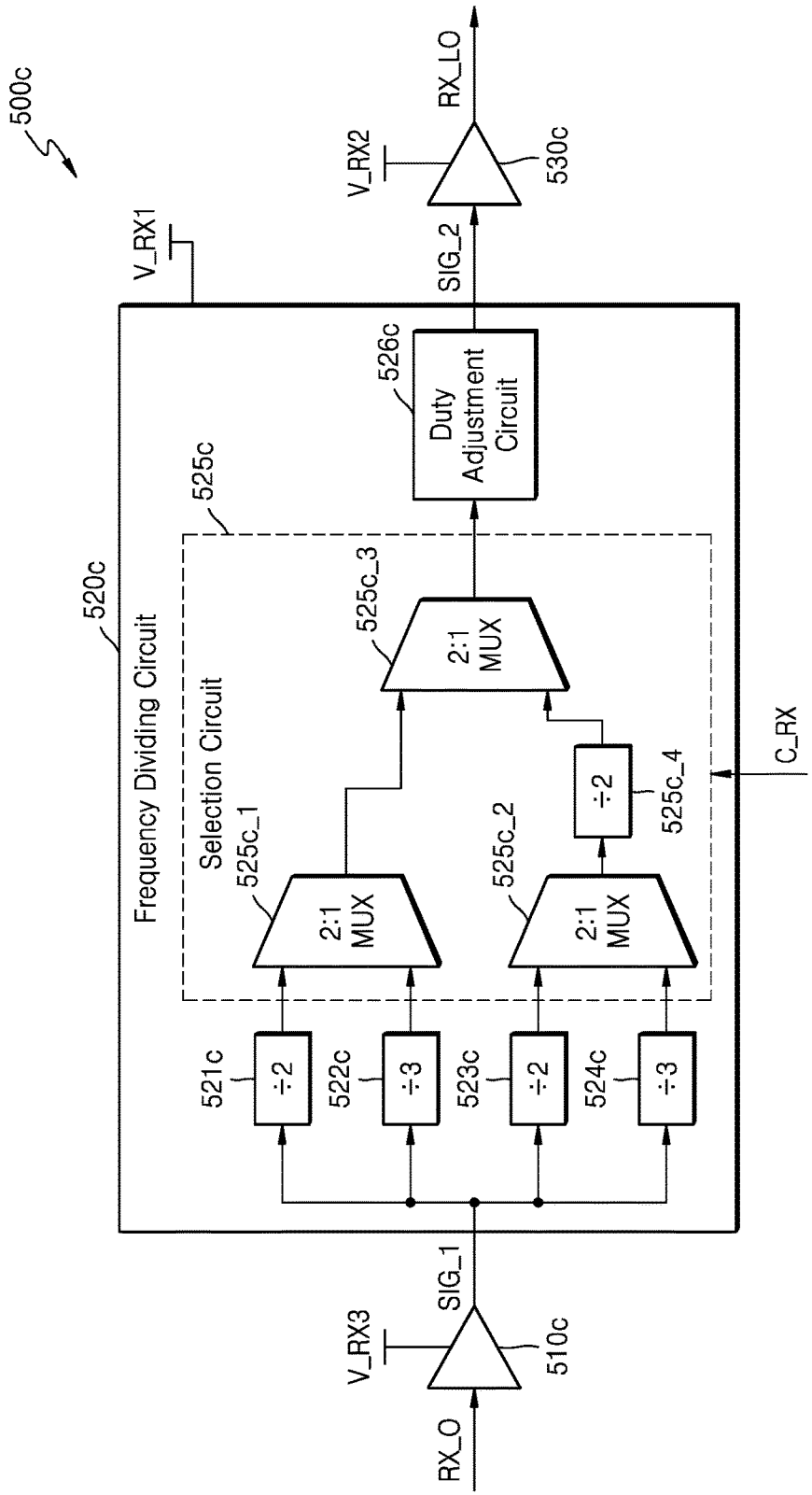
FIG. 10 is a block diagram of an RX LO generator according to some example embodiments of the present disclosure.

FIG. 10 is a block diagram of an RX LO generator 500c according to some example embodiments of the present disclosure. Like the RX LO generator 500a of FIG. 4, the RX LO generator 500c of FIG. 10 may include an input buffer 510c, a frequency dividing circuit 520c, and an output buffer 530c. Hereinafter, a description of FIG. 10 given above with reference to FIG. 4 will be omitted.

Referring to FIG. 10, the frequency dividing circuit 520c may include first frequency divider 521c, second frequency divider 522c, third frequency divider 523c, and fourth frequency divider 524c, a selection circuit 525c, and a duty adjustment circuit 526c. As shown in FIG. 10, at least one of frequency division ratios of the first to fourth frequency dividers 521c to 524c of FIG. 10 may be different from the first to fourth frequency dividers 521a to 524a of FIG. 4. That is, while the third and fourth frequency dividers 523a and 524a of FIG. 4 respectively have divide-by-four and divide-by-six frequency division ratios, the third and fourth frequency dividers 523c and 524c of FIG. 10 may respectively have divide-by-two and divide-by-three frequency division ratios. As described below, the third frequency divider 523c of FIG. 10 may form a divide-by-four frequency division ratio along with a fifth frequency divider 525c_4 included in the selection circuit 525c, and the fourth frequency divider 524c of FIG. 10 may form a divide-by-six frequency division ratio along with the fifth frequency divider 525c_4 included in the selection circuit 525c. The third and fourth frequency dividers 523c and 524c of FIG. 10 may share the fifth frequency divider 525c_4, and accordingly, an area and power consumption of the frequency dividing circuit 520c may decrease.

The selection circuit 525c may include first to third 2:1 multiplexers 525c_1, 525c_2, and 525c_3 (e.g., a plurality of 2:1 multiplexers), and the fifth frequency divider 525c_4 (also referred to herein as a second frequency divider) between the second and third 2:1 multiplexers 525c_2 and 525c_3 (e.g., connected between at least two 2:1 multiplexers of the plurality of 2:1 multiplexers). As shown in FIG. 10, the selection circuit 525c may include the first to third 2:1 multiplexers 525c_1, 525c_2, and 525c_3 disposed in a hierarchical fashion to select one of four oscillator signals received from the first to fourth frequency dividers 521c to 524c. The first to third 2:1 multiplexers 525c_1, 525c_2, and 525c_3 may select one of the four oscillator signals according to the RX control signal C_RX. In some example embodiments, as described above with reference to FIG. 9A, each of the first to third 2:1 multiplexers 525c_1, 525c_2, and 525c_3 may include gated inverters.

Figure 11:
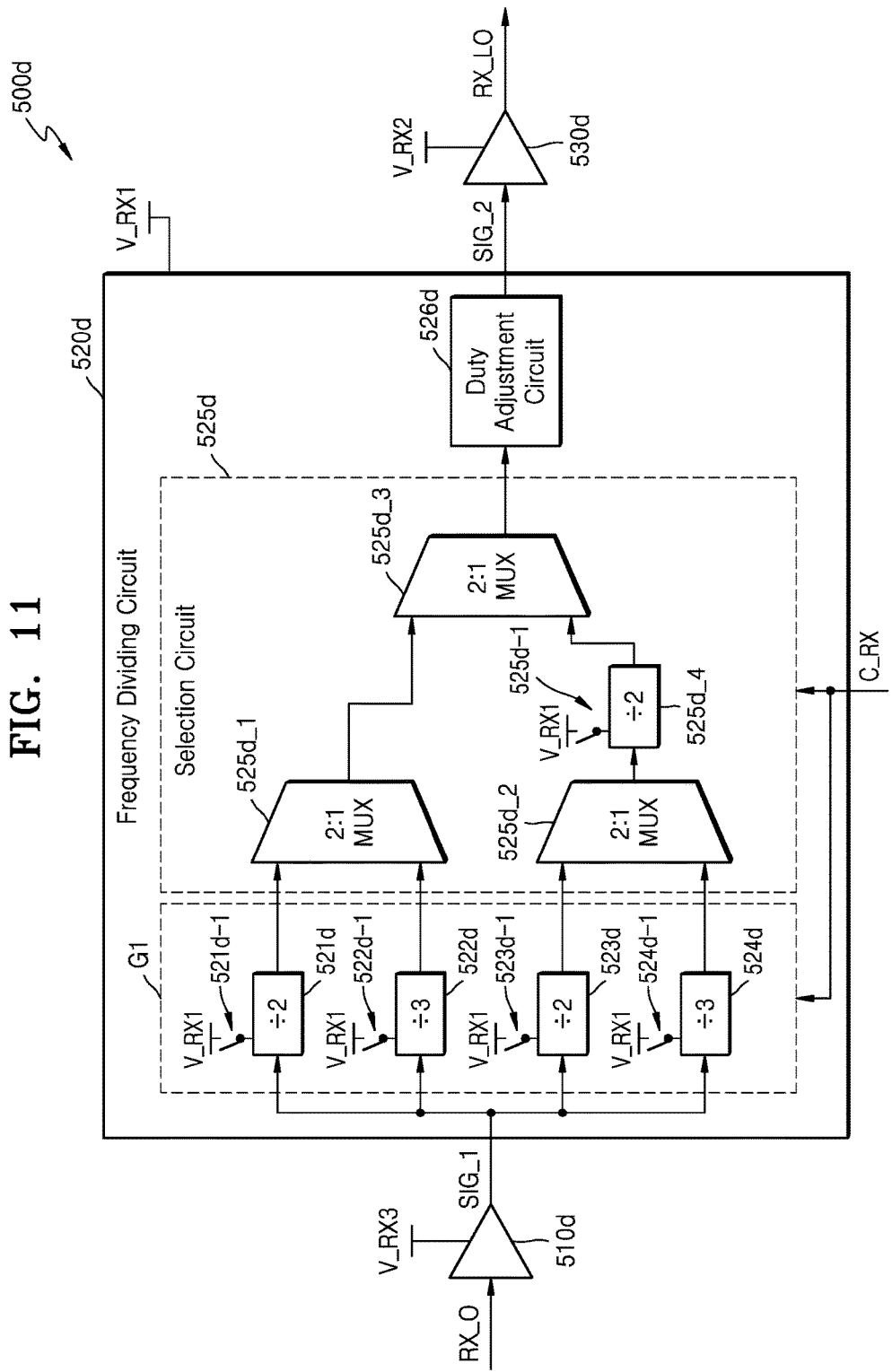
FIG. 11 is a block diagram of an RX LO generator according to some example embodiments of the present disclosure.

FIG. 11 is a block diagram of an RX LO generator 500d according to some example embodiments of the present disclosure. Like the RX LO generator 500c of FIG. 10, the RX LO generator 500d of FIG. 11 may include an input buffer 510d, a frequency dividing circuit 520d, and an output buffer 530d, and the frequency dividing circuit 520d may include first frequency divider 521d, second frequency divider 522d, third frequency divider 523d, fourth frequency divider 524d, a selection circuit 525d (including 2:1 multiplexers 525d_1, 525d_2 and 525d_3, switch 525d-1, and frequency divider 525d_4), and a duty adjustment circuit 526d. Hereinafter, a repeated description given already above with reference to FIG. 10 will be omitted.

Referring to FIG. 11, the frequency dividing circuit 520d may include a first switch 521d-1, a second switch 522d-1, a third 523d-1, a fourth switch 524d-1, and a fifth switch 525d-1. The first through fourth switches 521d-1 to 524d-1 may be collectively referred to as at least one first switch, and fifth switch 525d-1 may be referred to herein as at least one second switch. The at least one first switch (e.g., 521d-1 to 524d-1) may be configured to mutually independently cut off power supply to the first to fourth frequency dividers 521d to 524d, and the at least one second switch (e.g., 525d-1) may be configured to cut off power supply to the fifth frequency divider 525d_4. For example, the first switch 521d-1 may cut off supply of the first power voltage V_RX1 to the first frequency divider 521d. The first to fifth switches 521d-1 to 525d-1 may be controlled by the RX control signal C_RX, and may supply power to the first to fifth frequency dividers 521d to 524d and 525d_4 or cut off power supply to the first to fifth frequency dividers 521d to 524d and 525d_4 according to the RX control signal C_RX. In some example embodiments, the first to fifth switches 521d-1 to 525d-1 may include a PMOS transistor having a source to which the first power voltage V_RX1 is applied.

In some example embodiments, the first to fourth switches 521d-1 to 524d-1 of a first group G1 may be controlled by the RX control signal C_RX to cut off power supply to three frequency dividers outputting three oscillator signals not selected by the selection circuit 525d from among four oscillator signals output by the first to fourth frequency dividers 521d to 524d of the first group G1. Also, the fifth switch 525d-1 may also be controlled by the RX control signal C_RX to cut off power supply to the fifth frequency divider 525d_4 when an oscillator signal output by a second 2:1 multiplexer 525d_2 is not selected. For example, when the frequency dividing circuit 520d outputs the second internal oscillator signal SIG_2 by dividing a frequency of the first internal oscillator signal SIG_1 by two, the first switch 521d-1 may be closed to provide the first power voltage V_RX1 to the first frequency divider 521d, and the second to fifth switches 522d-1 to 525d-1 may be open to cut off supply of the first power voltage V_RX1 to the second to fifth frequency dividers 522d to 524d and 525d_4. Accordingly, power consumption by the second to fifth frequency dividers 522d to 524d and 525d_4 may be removed, and as a result, power consumption by the frequency dividing circuit 520d and an RX LO generator (for example, 150 of FIG. 1) including the same may decrease.

Although it is illustrated in FIG. 11 that supply of the first power voltage V_RX1 to the first to fifth frequency dividers 521d to 524d and 525d_4 may be cut off by the first to fifth switches 521d-1 to 525d-1, in some example embodiments, the first power voltage V_RX1 may be supplied to some of the first to fifth frequency dividers 521d to 524d and 525d_4 all the time, and supply of the first power voltage V_RX1 to the others may be cut off. As described above, control of one or more of the switches described herein may be implemented by the controller 14 as shown in FIG. 1.

Figure 12:
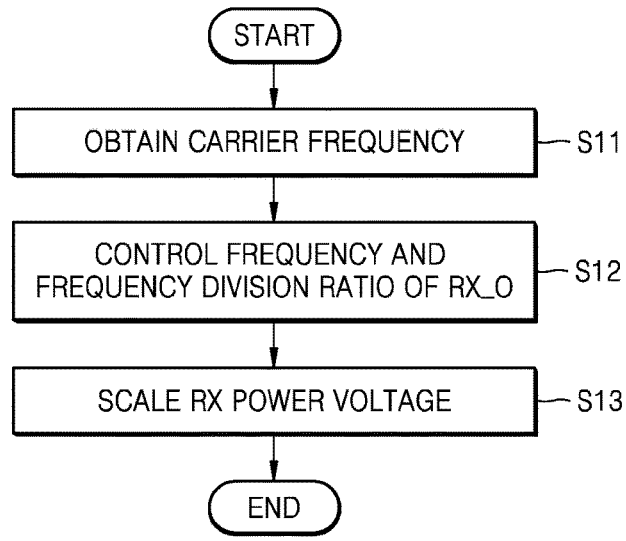
FIG. 12 is a flowchart of a method of controlling a transceiver of FIG. 1, according to some example embodiments of the present disclosure.

FIG. 12 is a flowchart of a method of controlling the transceiver 13 of FIG. 1, according to some example embodiments of the present disclosure. For example, the method of FIG. 12 may be performed by the controller 14 of FIG. 1, and may be referred to as an operation method of the controller 14. Hereinafter, FIG. 12 will be described with reference to FIG. 1.

Referring to FIG. 12, in operation S11, an operation of obtaining a carrier frequency may be performed. For example, the controller 14 may obtain, from the BS 20, a frequency of at least one carrier which is used in the downlink DL. For example, the BS 20 may provide, to the UE 10, information regarding at least one frequency channel which is used in the downlink DL to transmit data to the UE 10, and the controller 14 of the UE 10 may recognize a center frequency of the frequency channel as the carrier frequency.

In operation S12, an operation of controlling a frequency of the RX oscillator signal RX_O and a frequency division ratio may be performed. For example, based on the obtained carrier frequency, the controller 14 may determine the RX oscillator signal RX_O and a frequency division ratio of the RX LO generator 150 such that the RX LO signal RX_LO may have a frequency that is the same as the carrier frequency. Next, by activating/inactivating at least one VCO included in the RX oscillator 140 through the RX control signal C_RX or controlling a frequency of an oscillator signal output from the VCO, the controller 14 may control a frequency of the RX oscillator signal RX_O provided to the RX LO generator 150. Also, the controller 14 may control a frequency division ratio of the RX LO generator 150 through the RX control signal C_RX. Accordingly, the RX LO signal RX_LO output by the RX LO generator 150 may have a frequency that is the same as the carrier frequency.

In operation S13, an operation of scaling the RX power voltage V_RX may be performed. For example, the controller 14 may determine, based on the frequency of the RX oscillator signal RX_O determined in operation S12, a size ("magnitude") of the RX power voltage V_RX provided to the RX LO generator 150. In some example embodiments, the controller 14 is configured to determine a magnitude of the at least one power voltage of the RX power voltage V_RX (e.g., the third power voltage V_RX) based on a frequency of the input oscillator signal RX_O and the frequency division ratio of the RX LO generator 150. The controller 14 may generate the DVS control signal C_DVS based on the determined size of the RX power voltage V_RX, and the PMIC 15 may adjust a size of the RX power voltage V_RX based on the DVS control signal C_DVS. Accordingly, power unnecessarily consumed in the RX oscillator signal RX_O of a relatively low frequency may be removed, and as a result, power consumption of the RX LO generator 150 may decrease.

Figure 13:
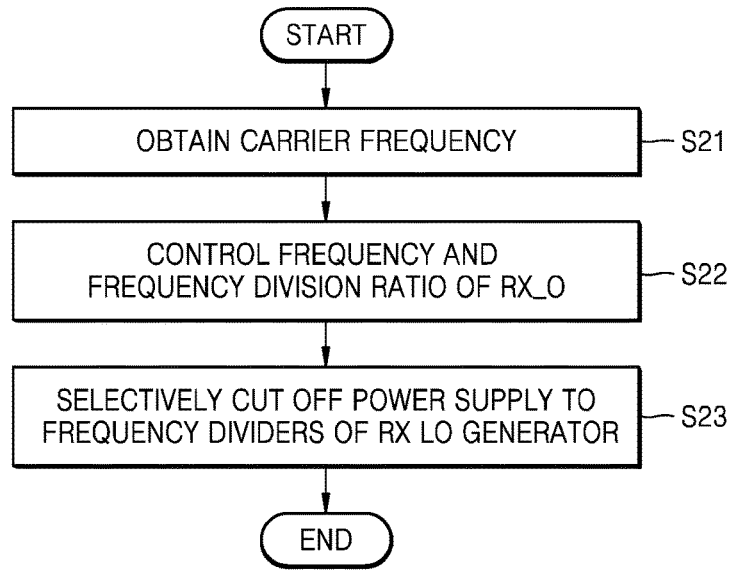
FIG. 13 is a flowchart of a method of controlling a transceiver of FIG. 1, according to some example embodiments of the present disclosure.

FIG. 13 is a flowchart of a method of controlling the transceiver 13 of FIG. 1, according to some example embodiments of the present disclosure. For example, the method of FIG. 13 may be performed by the controller 14 of FIG. 1 and may be referred to as an operation method of the controller 14. In some example embodiments, the method of FIG. 13 may be a method of controlling a transceiver including the RX LO generator 500d of FIG. 11. Hereinafter, FIG. 13 will be described based on the assumption that the controller 14 of FIG. 1 controls the RX LO generator 500d of FIG. 11.

Referring to FIG. 13, in operation S21, an operation of obtaining a carrier frequency may be performed. For example, like operation S11 of FIG. 12, the controller 14 may obtain, from the BS 20, a frequency of at least one carrier which is used in the downlink DL. For example, the BS 20 may provide, to the UE 10, information regarding at least one frequency channel which is used in the downlink DL to transmit data to the UE 10, and the controller 14 of the UE 10 may recognize a center frequency of the frequency channel as the carrier frequency.

In operation S22, an operation of controlling a frequency of the RX oscillator signal RX_O and a frequency division ratio may be performed. For example, like operation S12 of FIG. 12, based on the obtained carrier frequency, the controller 14 may determine the RX oscillator signal RX_O and a frequency division ratio of the RX LO generator 500d such that the RX LO signal RX_LO may have a frequency that is the same as the carrier frequency. Next, by activating/inactivating at least one VCO included in the RX oscillator 140 through the RX control signal C_RX or controlling a frequency of an oscillator signal output from the VCO, the controller 14 may control a frequency of the RX oscillator signal RX_O provided to the RX LO generator 500d. Also, the controller 14 may control a frequency division ratio of the RX LO generator 500d through the RX control signal C_RX. Accordingly, the RX LO signal RX_LO output by the RX LO generator 500d may have a frequency that is the same as the carrier frequency.

In operation S23, an operation of selectively cutting off power supply to the first to fifth frequency dividers 521d to 524d and 525d_4 of the RX LO generator 500d may be performed. For example, the controller 14 may recognize, based on the frequency division ratio of the RX LO generator 500d determined in operation S22, which of the first to fifth frequency dividers 521d to 524d and 525d_4 are not used to generate the RX LO signal RX_LO. The controller 14 may open at least one of the first to fifth switches 521d-1 to 525d-1 through the RX control signal C_RX in order to cut off power supply to ones of the first to fifth frequency dividers 521d to 524d and 525d_4 not used to generate the RX LO signal RX_LO. Accordingly, power consumption by an unused frequency divider may be removed, and as a result, power consumption by the RX LO generator 500d may decrease. Thus, where an LO generator (e.g., RX LO generator 150) includes at least one switch (e.g., 521d-1) configured to cut off power supplied to at least one frequency divider of the plurality of frequency dividers (e.g., 521d), the controller 14 may be configured to control the at least one switch (521d-1) based on the frequency of the input oscillator signal (e.g., RX_O) and a frequency division ratio of the LO generator.

In some example embodiments, the methods of controlling the transceiver 13 of FIG. 1 described above with reference to FIGS. 12 and 13 may be combined. That is, when the RX oscillator signal RX_O and a frequency division ratio of the RX LO generator 150 are determined, the RX power voltage V_RX that is supplied to the RX LO generator 150 may be determined and scaled, and power supply to at least one unused frequency divider from among a plurality of frequency dividers included in the RX LO generator 150 may be cut off.

While the inventive concepts has been particularly shown and described with reference to embodiments thereof, it will be understood that various changes in form and details may be made therein without departing from the spirit and scope of the following claims.

What is claimed is:

1. A local oscillator generator (LO generator) configured to transmit an LO signal to a mixer, the LO generator comprising:
   an input buffer configured to generate a first internal oscillator signal based on an input oscillator signal;
   a frequency dividing circuit configured to generate a second internal oscillator signal based on dividing a frequency of the first internal oscillator signal; and
   an output buffer configured to generate the LO signal based on the second internal oscillator signal,
   wherein the input buffer and the frequency dividing circuit are each configured to receive a power voltage independently of the output buffer,
   wherein the frequency dividing circuit includes
      a plurality of first frequency dividers configured to mutually independently divide the frequency of the first internal oscillator signal and generate separate, respective output signals of a plurality of output signals, and
      a selection circuit configured to selectively output one output signal of the plurality of output signals of the plurality of first frequency dividers as the second internal oscillator signal,
   wherein the selection circuit includes at least one 2:1 multiplexer disposed in a hierarchical fashion.

2. The LO generator of claim 1, wherein the input buffer and the frequency dividing circuit are further configured to mutually independently receive power voltages, respectively.

3. The LO generator of claim 1, wherein the output buffer includes an AC-coupled buffer, the AC-coupled buffer configured to AC-couple the second internal oscillator signal.

4. The LO generator of claim 3, wherein the AC-coupled buffer includes
   an inverter;
   a feedback resistor having two ends connected to an input terminal of the inverter and an output terminal of the inverter, respectively; and
   a capacitor having a first end and a second end, the first end configured to receive the second internal oscillator signal, the second end connected to the input terminal of the inverter.

5. The LO generator of claim 3, wherein
   the second internal oscillator signal has a duty cycle of 50%, and
   the output buffer further includes a duty adjustment circuit, the duty adjustment circuit configured to generate the LO signal such that the LO signal has a duty cycle of 25% from an output signal of the AC-coupled buffer.

6. The LO generator of claim 1, wherein the input buffer and the frequency dividing circuit are further configured to receive a variable power voltage, respectively.

7. The LO generator of claim 1, wherein the at least one 2:1 multiplexer includes two gated inverters.

8. The LO generator of claim 1, wherein the frequency dividing circuit further includes at least one first switch, the at least one first switch configured to cut off power that is supplied to at least one first frequency divider of the plurality of first frequency dividers.

9. The LO generator of claim 1, wherein the at least one 2:1 multiplexer includes a plurality of 2:1 multiplexers, and the selection circuit further includes at least one second frequency divider, the at least one second frequency divider connected between at least two 2:1 multiplexers of the plurality of 2:1 multiplexers.

10. The LO generator of claim 9, wherein the selection circuit further includes at least one second switch, the at least one second switch configured to cut off power that is supplied to the at least one second frequency divider.

11. The LO generator of claim 1, wherein
at least one first frequency divider of the plurality of first frequency dividers includes an injection-locked oscillator, the injection-locked oscillator including a plurality of gated inverters, the injection-locked oscillator including a sequence of stages, each stage including at least two gated inverters of the plurality of gated inverters,
each gated inverter of the plurality of gated inverters includes first and second PMOS transistors and first and second NMOS transistors connected in series sequentially between a positive power voltage and a negative power voltage,
the at least one first frequency divider is configured to generate, in a given stage of the sequence of stages, an input signal of a next stage in a plurality of drains of a second PMOS transistor and a first NMOS transistor of a gate inverter of the given stage, respectively,
the at least one first frequency divider is configured to apply, in the given stage of the sequence of stages, an output signal of a previous stage to a plurality of gates of a first PMOS transistor and a second NMOS transistor of the gate inverter of the given stage, respectively, and
the at least one first frequency divider is configured to apply the first internal oscillator signal to a plurality of gates of the second PMOS transistor and the first NMOS transistor of the gate inverter of the given stage, respectively.

12. The LO generator of claim 11, wherein each transistor of the first and second PMOS transistors and the first and second NMOS transistors is a fin field-effect transistor (FinFET).

13. The LO generator of claim 11, wherein the at least one first frequency divider is configured to divide a frequency of the first internal oscillator signal at a frequency division ratio of (2n+1), wherein a value of n is 1 or a prime number.

14. An apparatus for wireless communication, the apparatus comprising:
a local oscillator generator (LO generator) configured to generate a first internal oscillator signal based on an input oscillator signal, generate a second internal oscillator signal based on dividing a frequency of the first internal oscillator signal, and generate an LO signal based on the second internal oscillator signal, the LO generator further configured to receive a first power voltage;
a mixer configured to receive the LO signal; and
a controller configured to control the frequency of the input oscillator signal and a frequency division ratio of the LO generator based on a carrier frequency of the wireless communication, the controller further configured to control the first power voltage based on the frequency of the input oscillator signal and the frequency division ratio of the LO generator,
wherein the LO generator includes a frequency dividing circuit configured to generate the second internal oscillator signal based on dividing the frequency of the first internal oscillator signal,
wherein the frequency dividing circuit includes
a plurality of first frequency dividers configured to mutually independently divide the frequency of the first internal oscillator signal and generate separate, respective output signals of a plurality of output signals, and
a selection circuit configured to selectively output one output signal of the plurality of output signals of the plurality of first frequency dividers as the second internal oscillator signal,
wherein the selection circuit includes at least one 2:1 multiplexer disposed in a hierarchical fashion.

15. The apparatus of claim 14, wherein the LO generator includes
an input buffer configured to generate the first internal oscillator signal based on the input oscillator signal; and
an output buffer configured to generate the LO signal based on the second internal oscillator signal,
wherein the frequency dividing circuit is further configured to receive the first power voltage, and the output buffer includes an AC-coupled buffer, the AC-coupled buffer configured to receive a second power voltage and AC-couple the second internal oscillator signal.

16. The apparatus of claim 15, wherein
the input buffer is further configured to receive a third power voltage, and
the controller is further configured to determine a magnitude of the third power voltage based on the frequency of the input oscillator signal and the frequency division ratio of the LO generator.

17. The apparatus of claim 15, wherein
the mixer is a passive mixer, and
the output buffer further includes a duty adjustment circuit configured to generate the LO signal such that the LO signal has a duty cycle of 25% from an output signal of the AC-coupled buffer.

18. The apparatus of claim 14, wherein
the LO generator includes
a plurality of frequency dividers configured to mutually independently divide the frequency of the input oscillator signal and generate separate, respective output signals of a plurality of output signals; and
at least one switch configured to cut off power supplied to at least one frequency divider of the plurality of frequency dividers, and
the controller is further configured to control the at least one switch based on the frequency of the input oscillator signal and the frequency division ratio of the LO generator.

19. A frequency divider configured to divide a frequency of an oscillator signal of an oscillator, the frequency divider comprising:
an injection-locked oscillator, the injection-locked oscillator including a plurality of gated inverters, the injection-locked oscillator including a sequence of stages, each stage including at least two gated inverters of the plurality of gated inverters,
wherein each gated inverter of the plurality of gated inverters includes first and second PMOS transistors and first and second NMOS transistors which are each a fin field-effect transistor (FinFET), the first and second PMOS transistors and the first and second NMOS transistors connected in series sequentially from a positive power voltage to a negative power voltage,
wherein the frequency divider is configured to generate, in a given stage of the sequence of stages, an input signal of a next stage in a plurality of drains of the second PMOS transistor and the first NMOS transistor of a gate inverter of the given stage, respectively,
wherein the frequency divider is configured to apply, in the given stage of the sequence of stages, an output signal of a previous stage to a plurality of gates of the first PMOS transistor and the second NMOS transistor of the gate inverter of the given stage, respectively, respectively, wherein the frequency divider is configured to apply the oscillator signal to a plurality of gates of the second PMOS transistor and the first NMOS transistor of the gate inverter of the given stage, respectively.

\* \* \* \* \*